(12) United States Patent
Hugon et al.

(10) Patent No.: US 12,444,699 B2
(45) Date of Patent: Oct. 14, 2025

(54) METHOD FOR PROTECTING AN OPTOELECTRONIC DEVICE FROM ELECTROSTATIC DISCHARGES

(71) Applicant: Aledia, Echirolles (FR)

(72) Inventors: Xavier Hugon, Teche (FR); Frédéric Mayer, Voiron (FR); Frédéric Mercier, Saint-Nicolas-de-Macherin (FR); Ivan-Christophe Robin, Grenoble (FR)

(73) Assignee: Aledia, Echirolles (FR)

( * ) Notice: Subject to any disclaimer, the term of this patent is extended or adjusted under 35 U.S.C. 154(b) by 554 days.

(21) Appl. No.: 17/768,457

(22) PCT Filed: Oct. 7, 2020

(86) PCT No.: PCT/EP2020/078131
§ 371 (c)(1),
(2) Date: Apr. 12, 2022

(87) PCT Pub. No.: WO2021/073981
PCT Pub. Date: Apr. 22, 2021

(65) Prior Publication Data
US 2024/0120296 A1 Apr. 11, 2024

(30) Foreign Application Priority Data

Oct. 16, 2019 (FR) ..................................... 1911558

(51) Int. Cl.
*H01L 23/60* (2006.01)
*H01L 25/075* (2006.01)
(Continued)

(52) U.S. Cl.
CPC .......... *H01L 23/60* (2013.01); *H01L 25/0753* (2013.01); *H01L 25/167* (2013.01); *H10H 20/018* (2025.01); *H10H 20/857* (2025.01)

(58) Field of Classification Search
None
See application file for complete search history.

(56) References Cited

U.S. PATENT DOCUMENTS 7,608,919 B1 * 10/2009 Bernstein ................ H01L 24/24
257/E23.152
2002/0083576 A1 * 7/2002 Hsiao ................... G11B 5/3903
29/603.13

(Continued)

OTHER PUBLICATIONS

International Search Report and Written Opinion for International Application No. PCT/EP2020/078131, mailed Jan. 14, 2021.

*Primary Examiner* — Cory W Eskridge
(74) *Attorney, Agent, or Firm* — Wolf, Greenfield & Sacks, P.C.

(57) ABSTRACT

A method for protecting optoelectronic devices against electrostatic discharges. Each optoelectronic device includes an electronic circuit including at least one electronic component and one optoelectronic circuit bonded to the electronic circuit and including at last one optoelectronic component from among a light-emitting diode or a photodiode. The method includes forming of first and second wafers, one of the first or second wafer includes a plurality of copies of the electronic circuit and the other one of the first or second wafer including a plurality of copies of the optoelectronic circuit, the bonding of the first wafer to a support, the bonding of the second wafer to the first wafer, and the separation of the electronic devices from one another, wherein the first wafer and/or the second wafer comprises at least one system for protecting optoelectronic devices against electrostatic discharges.

6 Claims, 6 Drawing Sheets

(51) Int. Cl.
*H01L 25/16* (2023.01)
*H10H 20/01* (2025.01)
*H10H 20/857* (2025.01)

(56) References Cited

U.S. PATENT DOCUMENTS

| | | | |
|---|---|---|---|
| 2007/0262305 A1* | 11/2007 | Adkisson | H01L 23/60 |
| | | | 257/48 |
| 2010/0006864 A1* | 1/2010 | Steigerwald | H10H 20/018 |
| | | | 257/E33.056 |
| 2010/0127359 A1* | 5/2010 | Bazarjani | H01L 25/0655 |
| | | | 257/659 |
| 2012/0223416 A1* | 9/2012 | Scheubeck | H01L 25/167 |
| | | | 257/E29.327 |
| 2016/0141286 A1 | 5/2016 | Holz et al. | |
| 2016/0247990 A1 | 8/2016 | Scholz et al. | |
| 2017/0170211 A1* | 6/2017 | Yamazaki | H01L 29/7782 |
| 2021/0375797 A1* | 12/2021 | Cotronakis | H01L 24/49 |

\* cited by examiner

Fig. 5
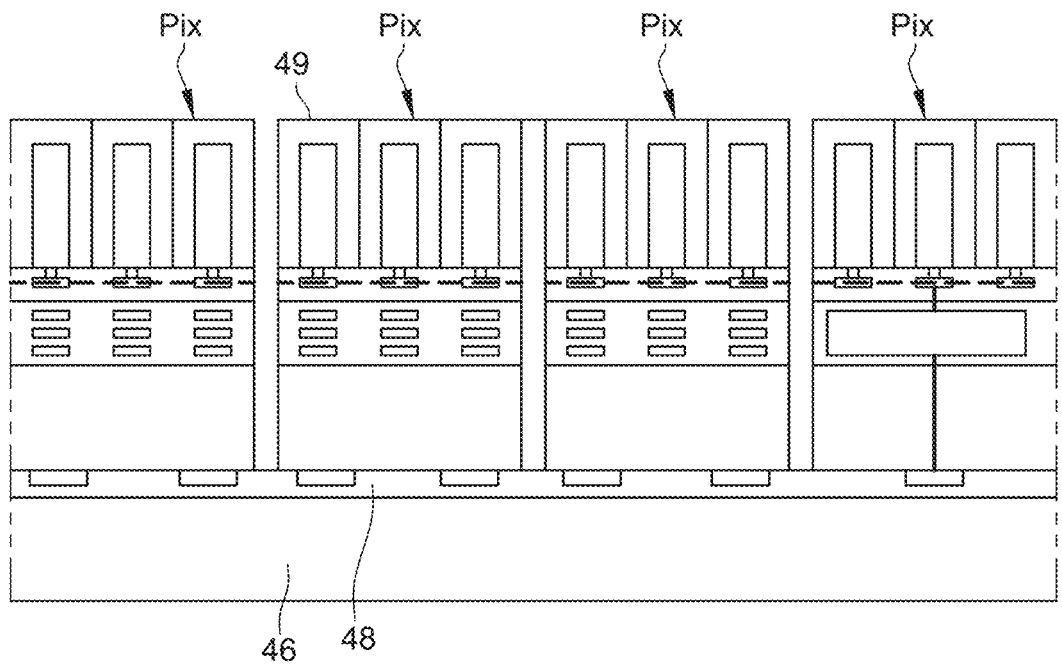
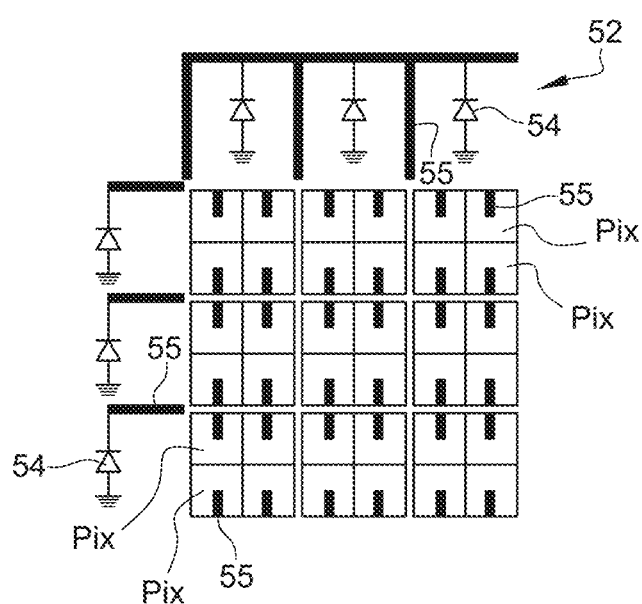
Fig. 6

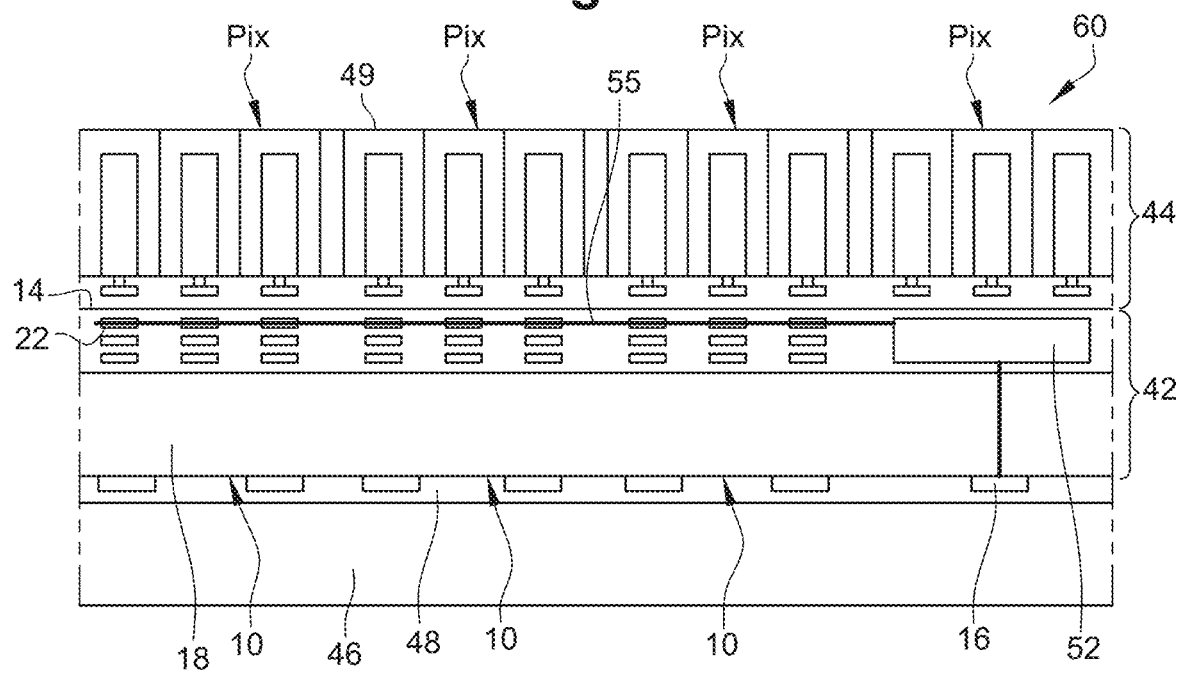
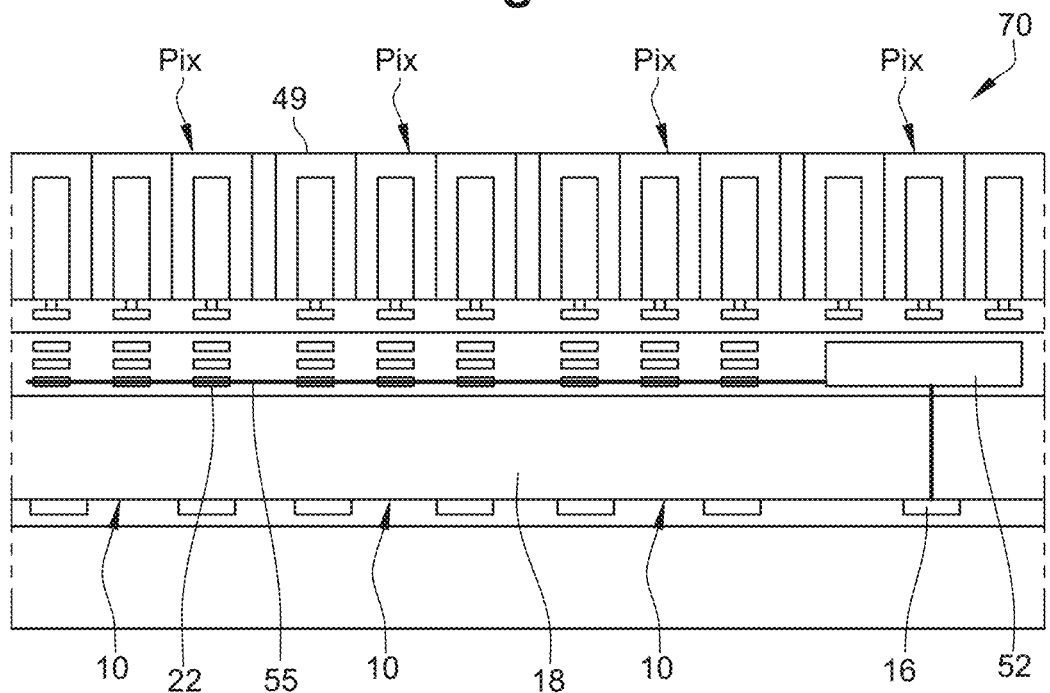

METHOD FOR PROTECTING AN OPTOELECTRONIC DEVICE FROM ELECTROSTATIC DISCHARGES

This application is a national stage filing under 35 U.S.C. § 371 of International Patent Application Serial No. PCT/EP2020/078131, filed Oct. 7, 2020, which claims priority to benefit of French patent application FR19/11558, filed Oct. 16, 2019, The content of these applications are incorporated herein by reference in their entireties.

TECHNICAL BACKGROUND

The present disclosure generally concerns systems and methods for protecting optoelectronic devices against electrostatic discharges.

PRIOR ART

The term optoelectronic devices is used to designate devices capable of converting an electric signal into an electromagnetic radiation or conversely, and particularly devices dedicated to the detection, the measurement, or the emission of an electromagnetic radiation. An example of application concerns a display screen comprising a support having distinct optoelectronic devices bonded thereto, each optoelectronic device comprising at least one light-emitting diode and corresponds to a display pixel. Another example of application concerns an image sensor comprising a support having optoelectronic devices individually bonded thereto, each optoelectronic device comprising at least one photodiode for the capture of signals relative to an image pixel.

It is known to include, in an electronic device, a system for protecting the electronic device against electrostatic discharges (ESDs), particularly electrostatic discharges likely to occur during the electronic device manufacturing and manipulation method.

However, for certain applications, it may not be possible to provide such a protection system in an optoelectronic device, particularly in the case where the optoelectronic device corresponds to a display pixel or to an image sensor pixel, to limit the dimensions of the optoelectronic device.

SUMMARY

Thus, an object of an embodiment is to at least partly overcome the disadvantages of the previously-described systems and methods for protecting optoelectronic devices against ESDs.

Another object of an embodiment is to protect optoelectronic devices against ESDs during the manufacturing of the optoelectronic devices.

Another object of an embodiment is for optoelectronic devices to be capable of being formed at an industrial scale and at a low cost.

An embodiment provides a method of protecting optoelectronic devices against electrostatic discharges, each optoelectronic device comprising an electronic circuit comprising at least one electronic component and an optoelectronic circuit bonded to the electronic circuit and comprising at last one optoelectronic component from among a light-emitting diode or a photodiode, the method comprising the forming of first and second wafers, one of the first or second wafer comprising a plurality of copies of the electronic circuit and the other one of the first or second wafer comprising a plurality of copies of the optoelectronic circuit, the bonding of the first wafer to a support, the bonding of the second wafer to the first wafer, and the separation of the electronic devices from one another, wherein the first wafer and/or the second wafer comprises at least one system for protecting optoelectronic devices against electrostatic discharges.

According to an embodiment, the first wafer and/or the second wafer comprises an electrostatic discharge protection circuit electrically coupled by electric links at least to the electronic components of a plurality of electronic circuits and/or to the optoelectronic components of a plurality of optoelectronic circuits, the step of separation of the electronic devices causing the interruption of the electric links between the protection circuit and the electric components and/or between the protection circuit and the optoelectronic components.

According to an embodiment, the protection circuit is coupled to the electric components and to the optoelectronic components by the conductive tracks.

According to an embodiment, the conductive tracks are made of a metal or of a non-metal electrically-conductive material, particularly made of doped silicon, of doped single-crystal silicon, or of polysilicon.

According to an embodiment, the step of separating of the optoelectronic devices comprises a step of cutting of the first and second wafers along cutting lines and the conductive tracks are at least partly located on the cutting lines.

According to an embodiment, the portions of the conductive tracks which are removed at the cutting step are located in the first wafer.

According to an embodiment, the portions of the conductive tracks which are removed at the cutting step are located in the second wafer.

An embodiment also provides a structure for the implementation of the method such as previously defined, comprising the first and second wafers and at least the system for protecting the optoelectronic devices against electrostatic discharges.

According to an embodiment, the protection system is common to a plurality of optoelectronic devices.

According to an embodiment, the protection system comprises a diode.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 5 is a drawing similar to FIG. 3 at another step of the method;

FIG. 6 is a partial simplified top view of the structure shown in FIG. 5;

FIG. 7 is a cross-section view of the structure obtained at a step of another embodiment of a method of manufacturing the optoelectronic device of FIG. 1 implementing an ESD protection;

FIG. 8 is a cross-section view of the structure obtained at a step of another embodiment of a method of manufacturing the optoelectronic device of FIG. 1 implementing a system for protecting the optoelectronic device against ESDs;

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. Unless specified otherwise, the expressions "around", "approximately", "substantially" and "in the order of" signify within 10%, and preferably within 5%. Further, it is here considered that the terms "insulating" and "conductive" respectively signify "electrically insulating" and "electrically conductive".

Embodiments of ESD protection systems and methods will be described for optoelectronic devices corresponding to display pixels. It should however be clear that these embodiments may be implemented for other types of optoelectronic devices, for example, image pixel sensors.

Figure 1:
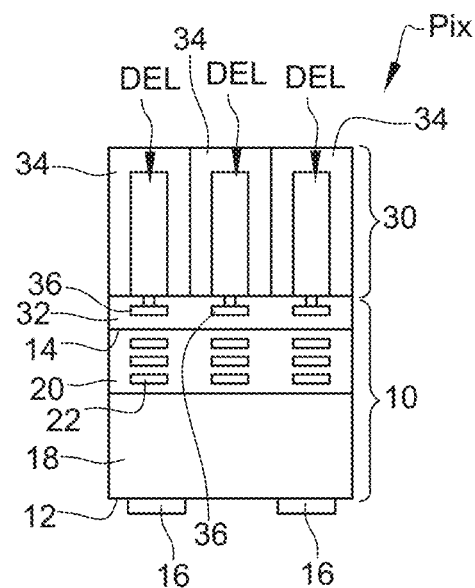
FIG. 1 is a partial simplified cross-section view of an example of an optoelectronic device comprising light-emitting diodes.

FIG. 1 is a partial simplified cross-section view of an embodiment of a display pixel Pix. Display pixel Pix comprises from bottom to top in FIG. 1:
an electronic circuit 10, called control circuit hereafter; and
an optoelectronic circuit 30.

Control circuit 10 comprises a lower surface 12 and an upper surface 14 opposite to lower surface 12, surfaces 12 and 14 being preferably parallel. Control circuit 10 further comprises conductive pads 16 on lower surface 12. Control circuit 10 may comprise a semiconductor substrate 18, a stack 20 of insulating layers covering substrate 18, and conductive tracks 22 of several metallization levels formed between the insulating layers of stack 20 and connected by conductive vias, not shown. Control circuit 10 may further comprise electronic components, not shown in FIG. 1, particularly transistors, formed inside and/or on top of substrate 18. An insulating layer, not shown, may cover semiconductor substrate 18 on the side opposite to stack 20 and delimit the lower surface 12 of control circuit 10. Control circuit 10 may further comprise through conductive vias, not shown, extending in substrate 18, across the entire thickness of substrate 18, and electrically insulated from the substrate, and enabling to electrically couple pads 16 to the front side of substrate 18. Semiconductor substrate 18 is for example a silicon, particularly single-crystal silicon, substrate. The electronic components may then comprise insulated gate field-effect transistors, also called MOS transistors. According to another embodiment, substrate 18 may correspond to a non-semiconductor substrate. According to an embodiment, the electronic components may comprise thin-film transistors, also called TFTs, and substrate 18 can then be omitted.

Optoelectronic circuit 30 is bonded to the upper surface 14 of control circuit 10. As a variant, particularly when the electronic components comprise thin-film transistors, also called, TFTs, control circuit 10 may be directly formed on optoelectronic circuit 30.

Optoelectronic circuit 30 comprises a support 32 having light-emitting diodes DEL, preferably at least three light-emitting diodes, formed thereon. Optoelectronic circuit 30 may comprise photoluminescent blocks 34 covering light-emitting diodes DEL on the side opposite to control circuit 10. Each photoluminescent block 34 is opposite at least one of light-emitting diodes DEL.

Optoelectronic circuit 30 comprises conductive elements 36 located in support 32, and connected to the electrodes of light-emitting diodes DEL. Optoelectronic circuit 30 is electrically coupled to control circuit 10 by conductive pads, which may correspond to conductive elements 36 and which are in contact with conductive pads of control circuit 10.

Preferably, optoelectronic circuit 30 only comprises light-emitting diodes DEL and the conductive elements 36 of these light-emitting diodes DEL, and control circuit 10 comprises all the electronic components necessary to control the light-emitting diodes DEL of optoelectronic circuit 30. As a variant, optoelectronic circuit 30 may also comprise other electronic components in addition to light-emitting diodes DEL.

Figure 2:
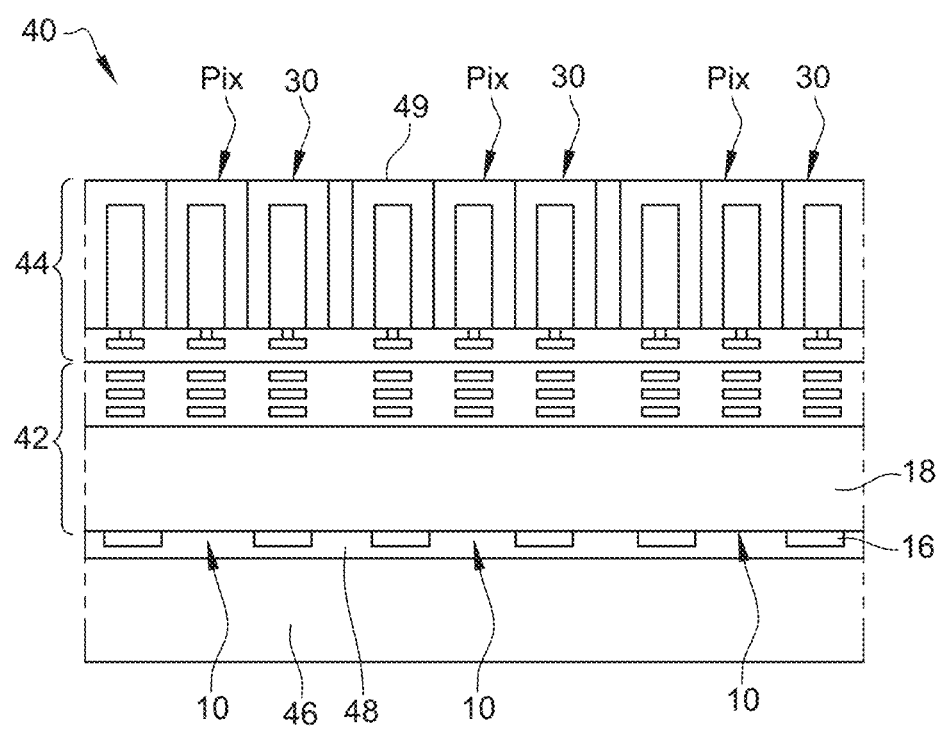
FIG. 2 is a cross-section view of the structure obtained at a step of an example of a method of manufacturing the optoelectronic device of FIG. 1.

FIG. 2 is a cross-section view of a structure 40 obtained at a step of an example of a method of manufacturing the display pixel Pix of FIG. 1. Structure 40 comprises an integrated circuit wafer 42 comprising a plurality of copies of control circuit 10 and a wafer 44 comprising a plurality of copies of optoelectronic circuit 30, three control circuits 10 and three optoelectronic circuits 30 being shown. Each wafer 42, 44 may be manufactured separately. In particular, the wafer 42 comprising control circuits 10 may be manufactured by implementing CMOS transistor manufacturing techniques. The wafer 44 comprising optoelectronic circuits 30 may then be bonded to the wafer 42 comprising control circuits 10, for example, by hybrid molecular bonding. The manufacturing method may comprise the temporary bonding of wafer 42 to a support 46, also called handle, by means of a glue layer 48. The use of handle 16 may particularly be provided after a step of bonding of wafer 42 to wafer 44 followed by a step of thinning of substrate 18. A cutting step may then be implemented to individualize display pixels Pix. The cutting is performed on the side of the upper surface 49 of structure 40, which is the surface of wafer 44 most distant from handle 46. Display pixels Pix may then be removed form support 46 and bonded to another support, for example, a printed circuit, to obtain a display screen.

A display screen may comprise from 10 to $10^9$ display pixels Pix. Each display pixel Pix may occupy in top view a surface area in the range from 1 $\mu m^2$ to 100 $mm^2$. The thickness of each display pixel Pix may be in the range from 1 $\mu m$ to 6 mm.

Electrostatic discharges may occur during the manufacturing of wafers 42, 44 and during the manipulation of display pixels Pix once individualized.

Figure 3:
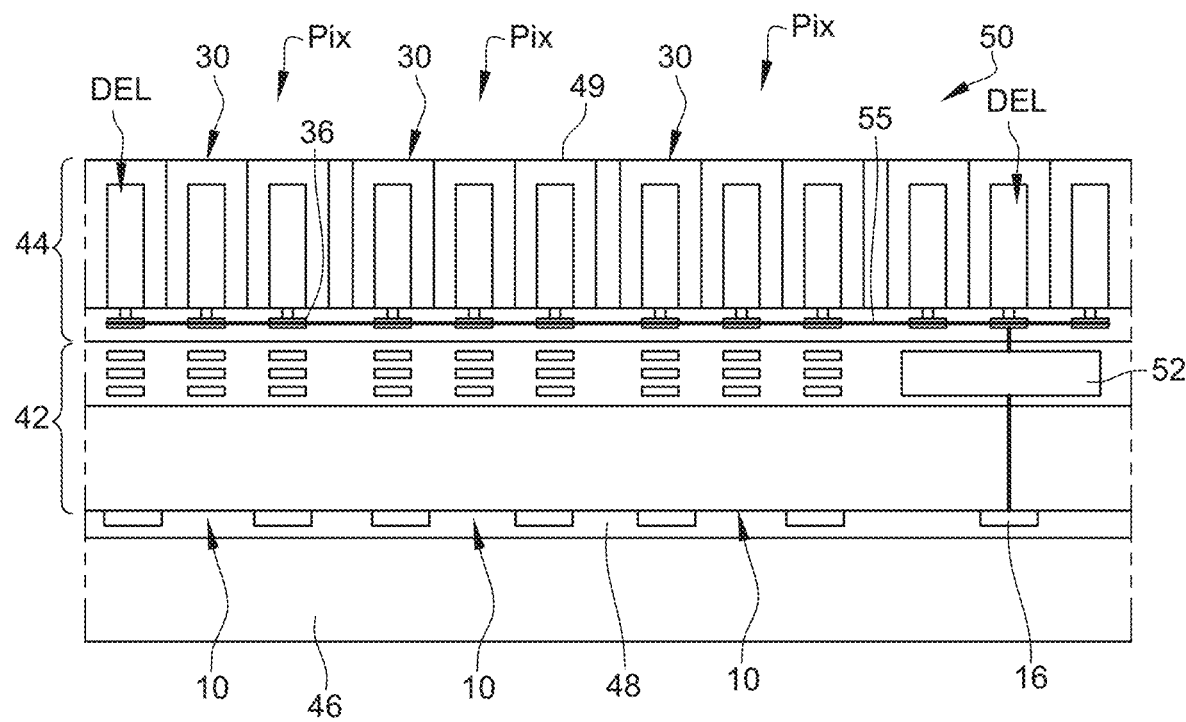
FIG. 3 is a cross-section view of the structure obtained at a step of an embodiment of a method of manufacturing the optoelectronic device of FIG. 1 implementing an ESD protection.
Figure 4:
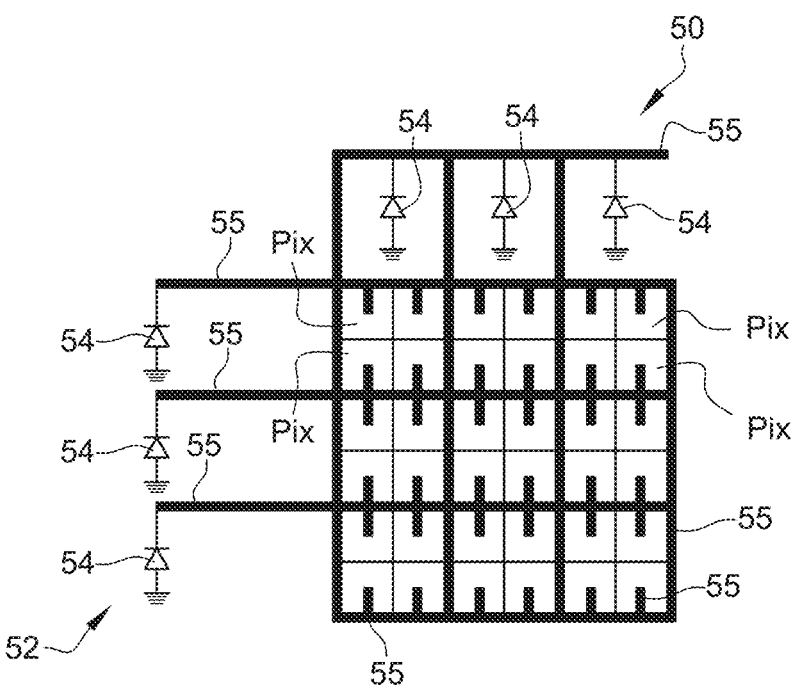
FIG. 4 is a partial simplified top view of the structure shown in FIG. 3.

FIGS. 3 and 4 are respectively a lateral cross-section view and a top view, partial and simplified, of a structure 50 obtained at a step of an embodiment of a method of manufacturing display pixels Pix such as shown in FIG. 1 enabling to protect display pixels Pix against ESDs during steps of manufacturing of display pixels Pix until the individualization of pixels Pix.

Structure 50 comprises all the elements of the structure 40 shown in FIG. 2 and further comprises an ESD protection system 52 provided in the wafer 42 of control circuits 10. Protection system 52 aims at forming a preferred path for the flowing of current in the case of an ESD to avoid a degradation of the light-emitting diodes DEL of the optoelectronic circuits 30 and/or of the electronic components of control circuits 10. According to an embodiment, protection system 52 may comprise one or a plurality of electronic components, for example, diodes 54 schematically shown in FIG. 4. According to another embodiment, protection system 52 corresponds to a simple short-circuit. The electronic components forming protection system 52 are located in a portion of wafer 42, which after the step of separation of display pixels Pix is no longer functional. As an example, FIG. 4 shows the diodes 54 of protection system 52 at the periphery of wafer 42. As a variant, on a same wafer 42, electronic circuits 10 may be arranged in groups of electronic circuits and the protection systems may be provided for each group of electronic circuits. Wafer 44 may comprise light-emitting diodes DEL opposite the portion of wafer 42 where protection system 52 is formed, which light-emitting diodes DEL are not intended to be used after the step of separation of display pixels Pix.

Protection system 52 is electrically connected to all the electronic components of the wafer 42 or of the wafer 44 to be protected against ESDs by electric links 55 shown in thick lines in FIGS. 3 and 4. Protection system 52 is further coupled to one of the conductive pads 16 of wafer 42 that may be grounded. Glue layer 48 and handle 46 may be made of conductive materials to ease the removal of the charges crossing protection system 52. According to an embodiment, protection system 52 corresponds to a short-circuit provided between one of conductive pads 16 and electric links 55.

In the present embodiment, the electric links 55 between protection system 52 and the light-emitting diodes are formed by the conductive elements 36 present in wafer 44. The electric connection between protection system 52 and the electronic components of electronic circuits 10 may be at least partly formed by the electric links between light-emitting diodes DEL and these electronic components.

FIGS. 5 and 6 are drawings respectively similar to FIGS. 3 and 4 illustrating the structure obtained after the cutting of wafers 42 and 44 to individualize display pixels Pix. The cutting step may be performed by laser cutting or plasma cutting. Protection system 52 is arranged in a portion of wafer 42 which is not intended to be used as pixels after the cutting step. The dimensions of the display pixels are substantially the same as those obtained in the absence of protection system 52.

At least a portion of the electric links 55 used to electrically connect protection system 52 to display pixels Pix are arranged at the level of the cutting paths of wafers 42 and 44. Thereby, after the cutting step, electric links 55 are interrupted so that the light-emitting diodes DEL of optoelectronic circuits 30 and the electronic components of electronic circuits 10 which were shorted by electric links 55 are not longer in short-circuit. After the cutting step, the structure of display pixels Pix is modified as little as possible with respect to the structure of the display pixel which would be obtained in the absence of the ESD protection.

FIG. 7 is a cross-section view of a structure 60 obtained at a step of another embodiment of a method of manufacturing display pixels Pix having the structure shown in FIG. 1 enabling to protect display pixel Pix against ESDs during steps of manufacturing of display pixels Pix until the individualization of the display pixels.

Structure 60 comprises all the elements of the structure 50 shown in FIG. 3 with the difference that the electric links 55 between protection system 52 and the components to be protected are formed by conductive tracks 22 formed in wafer 42, for example conductive tracks 22 of any of the metallization levels, and which may be metal tracks, and particularly conductive tracks 22 of one of the last metallization levels, that is, the levels most distant from substrate 18. According to an embodiment, considering that the conductive pads of electronic circuits 10 are formed in the last metallization level of electronic circuits 10, the conductive tracks 22 used to form electric links 55 may be in the penultimate metallization level of electronic circuits 10.

FIG. 8 is a cross-section view of a structure 70 obtained at a step of another embodiment of a method of manufacturing the display pixel Pix of FIG. 1 enabling to protect display pixel Pix against ESDs during the steps of manufacturing of display pixel Pix until the individualization of the display pixel.

Structure 70 comprises all the elements of the structure 50 shown in FIG. 3 with the difference that the electric links 55 between protection system 52 and the components to be protected are formed by conductive tracks 22 formed in wafer 42, for example, conductive tracks of the first metallization level, that is, the level closest to substrate 18, which may be polysilicon conductive tracks.

The structure 50 shown in FIG. 3 has the advantage that the electric links 55 between protection system 52 and display pixels Pix are close to the surface 49 from which the cutting is initiated and thus more easily accessible.

The structure 70 shown in FIG. 8 has the advantage that the connection elements between the protection system and the display pixels may be made of polysilicon, which is a material that can be etched more easily than a metal or a metal alloy.

Figure 9:
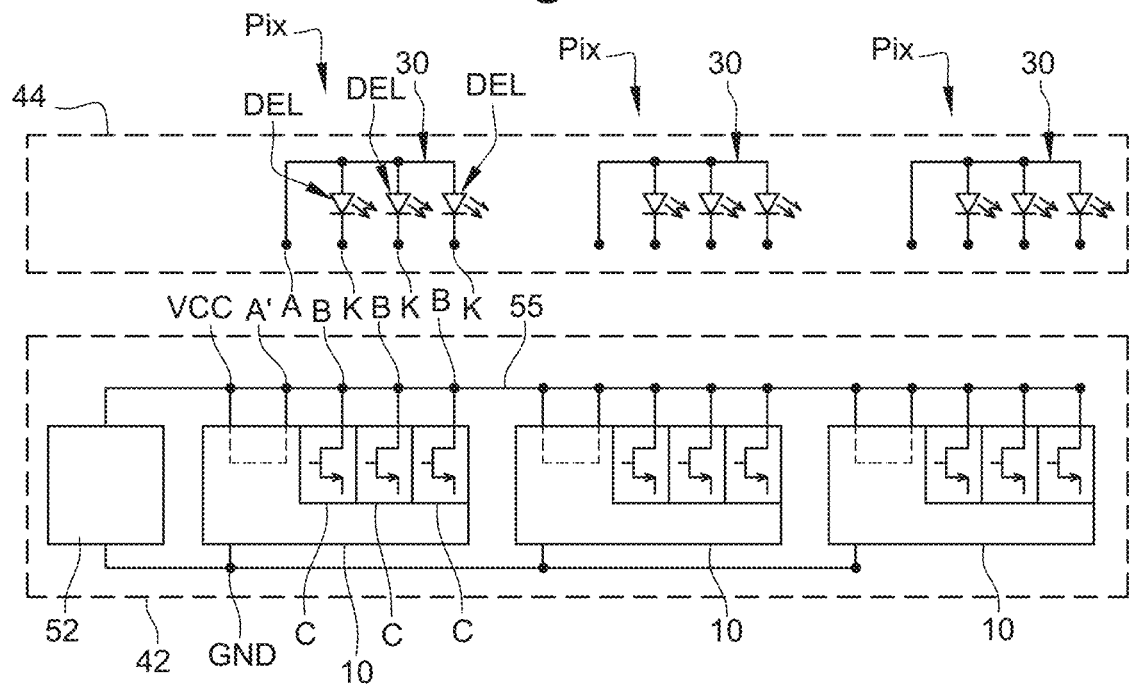
FIG. 9 shows an embodiment of an equivalent electric diagram of the structure shown in FIG. 7 or 8.
Figure 10:
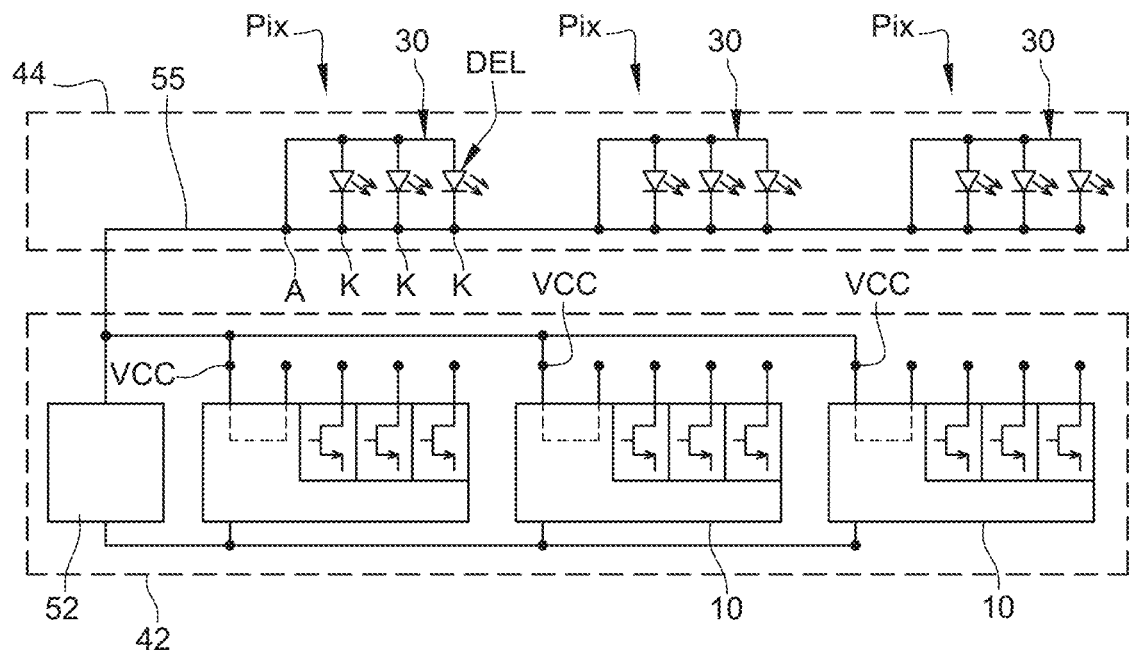
FIG. 10 shows an embodiment of an equivalent electric diagram of the structure shown in FIG. 3.

FIG. 9 shows an embodiment of an equivalent electric diagram of the structure 60 shown in FIG. 7 or of the structure 70 shown in FIG. 8 and FIG. 10 shows an embodiment of an equivalent electric diagram of the structure 50 shown in FIG. 3. In FIGS. 9 and 10, for each pixel Pix, optoelectronic circuit 30 comprises at least three light-emitting diodes DEL, the light-emitting diodes DEL being at the common anode electrode A and comprising distinct cathode electrodes K. Further, in FIGS. 9 and 10, for each display pixel Pix, control circuit 10 comprises, for each light-emitting diode DEL, a MOS transistor circuit C for controlling the light-emitting diode DEL comprising a terminal B which is connected to the cathode K of light-emitting diode DEL when wafer 44 is bonded to wafer 42. Further, for each display pixel Pix, control circuit 10 comprises a terminal A' connected to the common anode electrode A of light-emitting diodes DEL when wafer 44 is bonded to wafer 42, a terminal GND intended in operation to receive a low reference potential, for example, the ground, and a terminal VCC intended to receive in operation a high reference potential. The high and low potentials may be applied between the conductive pads 16 of control circuit 10 in operation. According to an embodiment, terminals B, A', and VCC may correspond to conductive tracks 22 present in the stack 20 of electronic circuit 10.

In the equivalent electric diagram of FIG. 9, protection system 52 is connected to the terminals B, A', and VCC of all the display pixels Pix, for example, by conductive tracks of one of the metallization levels of electronic circuit 10 and protection system 52 is connected to the GND terminals of all the display pixels Pix, for example, via conductive glue layer 48, which electrically connects pads 16 until the step of separation of display pixels Pix. The cutting step causes, for each display pixel Pix, the interruption of the electric links 55 between terminals B, A', and VCC.

In the equivalent electric diagram of FIG. 10, protection system 52 is connected to the terminals A and K of all the display pixels Pix, for example, by the conductive elements of optoelectronic circuits 30 and protection system 52 is connected to the terminals GND of all the display pixels Pix, for example, via conductive glue layer 48, which electrically connects pads 16 until the step of separation of display pixels Pix. Protection system 52 may further be connected to the terminals VCC of all the display pixels Pix, for example, by conductive tracks of one of the metallization levels of the electronic circuits to ensure that all the possible current circulation paths during electrostatic discharges are protected. The cutting step causes, for each display pixel Pix, the interruption of the electric links between terminals A and K.

Figure 11:
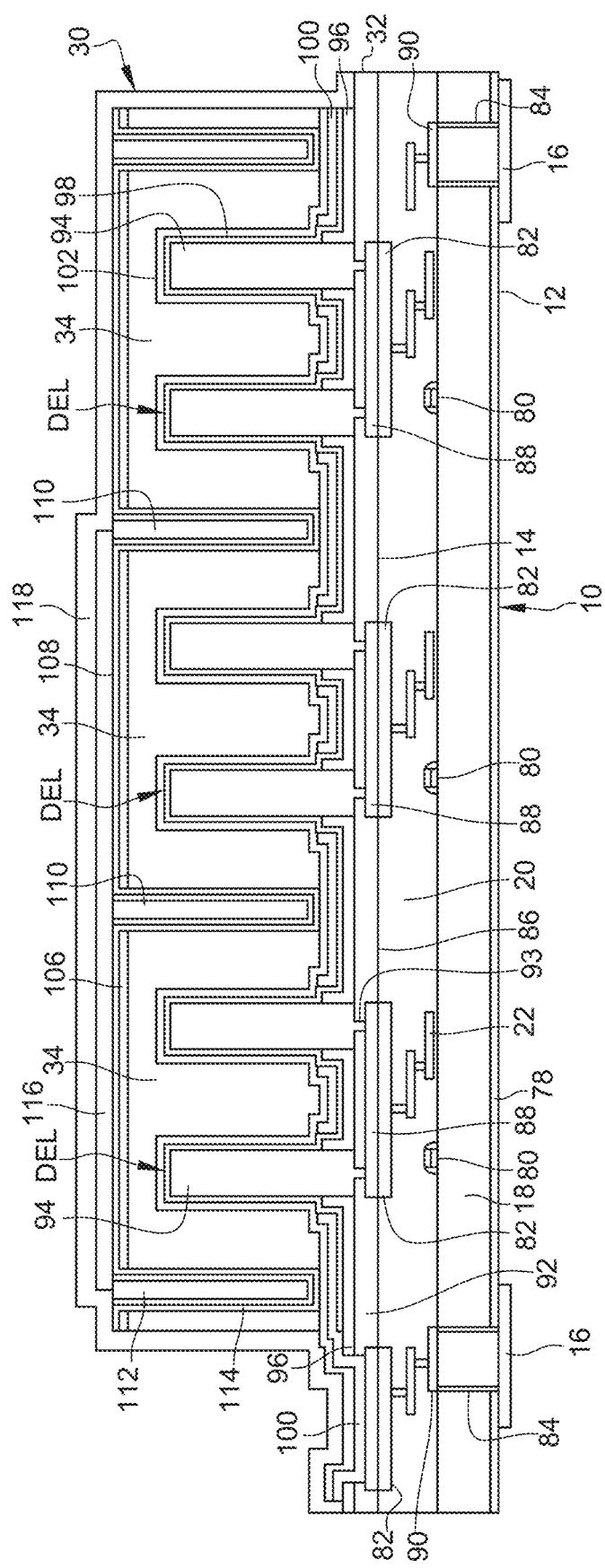
FIG. 11 is a partial simplified cross-section view of a more detailed embodiment of the structure of a display pixel.

FIG. 11 is a partial simplified cross-section view of a more detailed embodiment of display pixel Pix.

According to an embodiment, the control circuit 10 of display pixel Pix comprises from bottom to top in FIG. 11:
  semiconductor substrate 18, for example, single-crystal silicon, an insulating layer 78 on the side of lower surface 12, and the two conductive pads 16;
  MOS transistors 80, formed inside and on top of substrate 18;
  stack 20 of insulating layers, for example, made of silicon oxide and/or of silicon nitride, covering substrate 18 and the conductive tracks 22 of a plurality of metallization levels formed between the insulating layers of stack 20, having in particular pads 82 exposed on the upper surface 14 of electronic circuit 10, where the conductive tracks 22 of the first metallization level may be made of polysilicon and particularly form the gates of MOS transistors 80 and where the conductive tracks 22 of the other metallization levels may be metal tracks, for example, made of aluminum, of silver, of copper, or of zinc; and
  conductive and laterally insulated vias 84, also called TSVs (Through Silicon Vias) crossing substrate 18 and coupling pads 16 to pads 90 of the first metallization level of stack 20.

According to an embodiment, the optoelectronic circuit 30 of display pixel Pix comprises from bottom to top in FIG. 11:
  support 32 comprising a lower surface 86 in contact with upper surface 14 and comprising conductive pads 88 exposed on lower surface 86, in contact with pads 82, and a multilayer insulating structure 92, for example, made of silicon oxide or of silicon nitride, extending between pads 88 and covering pads 88 and comprising openings 93 exposing portions of pads 88;
  microwires or nanowires 94, called wires hereafter (six wires being shown), each wire 94 being in contact with one of pads 88 through one of opening 93;
  an insulating layer 96 extending on the lateral sides of a lower portion of each wire 94 and extending on insulating layer 92 between wires 94;
  a shell 98 comprising a stack of semiconductor layers covering an upper portion of each wire 94 and extending on insulating layer 96 between wires 94, shell 98 particularly comprising an active layer which is the layer having most of the radiation supplied by the light-emitting diode emitted therefrom and comprising, for example, confinement means, such as multiple quantum wells;
  a conductive and reflective layer 100, extending on shell 98 between wires 94;
  a layer 102 forming an electrode covering, for each wire 94, shell 98 and further extending on conductive layer 100 between wires 94, electrode layer 102 being adapted to giving way to the electromagnetic radiation emitted by the light-emitting diodes and being formed of a transparent and conductive material such as indium-tin oxide (or ITO), aluminum- or gallium-doped zinc oxide, or graphene;
  photoluminescent blocks 34 covering certain assemblies of light-emitting diodes DEL or blocks transparent to the radiation emitted by the light-emitting diodes, each photoluminescent block comprising luminophores adapted, when they are excited by the light emitted by the associated light-emitting diodes DEL, to emitting light at a wavelength different from the wavelength of the light emitted by the associated light-emitting diodes DEL;
  an insulating layer 106 covering the upper surface of each block 34, which insulating layer 106 may not be present;
  a protection layer 108 covering insulating layers 106, the lateral surfaces of blocks 34, and the electrode layer 102 between the blocks;
  walls 110 between the blocks, where each wall 110 may comprise a core 112 surrounded with a coating 114 reflective at the wavelength of the radiation emitted by photoluminescent blocks 34 and/or light-emitting diodes DEL;
  a color filter 116 covering at least some of photoluminescent blocks 34; and
  an encapsulation layer 118 covering the entire structure.

Each wire 94 for example has a mean diameter, for example corresponding to the diameter of the disk having the same area as the cross-section of wire 94, in the range from 5 nm to 5 μm, preferably from 100 nm to 2 μm, more preferably from 200 nm to 1.5 μm, and a height greater than or equal to 1 time, preferably greater than or equal to 3 times, and more preferably still greater than or equal to 5 times the mean diameter, particularly greater than 500 nm, preferably in the range from 1 μm to 50 μm. Wires 94 comprise at least one semiconductor material. The semiconductor material may be silicon, germanium, silicon carbide, a III-V compound, for example, GaN, AlN, InN, InGaN, AlGaN, or AlInGaN, a II-VI compound, or a combination of at least two of these compounds.

According to an embodiment, the light-emitting diodes DEL are adapted to emitting blue light, that is, a radiation having a wavelength in the range from 430 nm to 490 nm. According to an embodiment, the first wavelength corresponds to green light and is in the range from 510 nm to 570 nm. According to an embodiment, the second wavelength corresponds to red light and is in the range from 600 nm to 720 nm. According to another embodiment, the light-emitting diodes DEL are for example capable of emitting an ultraviolet radiation. According to an embodiment, the first wavelength corresponds to blue light and is within the range from 430 nm to 490 nm. According to an embodiment, the second wavelength corresponds to green light and is within the range from 510 nm to 570 nm. According to an embodiment, the third wavelength corresponds to red light and is within the range from 600 nm to 720 nm.

Various embodiments and variants have been described. Those skilled in the art will understand that certain features of these various embodiments and variants may be combined, and other variants will occur to those skilled in the art. In particular, even though embodiments have been described in the case of display pixels comprising light-emitting diodes comprising microwires or nanowires, it should be clear that these embodiments may concern a display pixel comprising light-emitting diodes comprising micrometer-range or nanometer-range pyramids, a pyramid being a three-dimensional structure having a portion of elongated pyramidal or conical shape. This pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm. Further, although embodiments have been described in the case of display pixels comprising light-emitting diodes comprising microwires or nanowires, it should be clear that these embodiments may concern a display pixel comprising planar light-emitting diodes where each light-emitting diode is formed by a stack of planar semiconductor layers.

The invention claimed is:

1. Method of protecting optoelectronic devices against electrostatic discharges, each optoelectronic device comprising an electronic circuit comprising at least one electronic component and an optoelectronic circuit bonded to the electronic circuit and comprising at least one optoelectronic component from among a light-emitting diode or a photodiode, the method comprising the forming of first and second wafers, the first wafer comprising a plurality of copies of the electronic circuit and the second wafer comprising a plurality of copies of the optoelectronic circuit, the bonding of one of the first or second wafers to a support, the bonding of the other one of the first or second wafers to the one of the first or second wafers, and the separation of the electronic devices from one another, wherein the first wafer and the second wafer comprises at least one system for protecting optoelectronic devices against electrostatic discharges, the protection system no longer being functional after the step of separation of the electronic devices from one another, wherein the first wafer comprises an electrostatic discharge protection circuit, wherein the protection circuit is electrically coupled by conductive tracks to the electronic components of the plurality of electronic circuits and to the optoelectronic components of the plurality of optoelectronic circuits, the step of separation of the electronic devices causing the interruption of the conductive tracks between the protection circuit and the electric components and between the protection circuit and the optoelectronic components, wherein the step of separation of the optoelectronic devices comprises a step of cutting of the first and second wafers along cutting lines and wherein the conductive tracks are at least partly located on the cutting lines, wherein the portions of the conductive tracks which are removed at the cutting step are located in the second wafer.

2. Method according to claim 1, wherein the conductive tracks are metallic or made of a non-metal electrically-conductive material, particularly doped silicon.

3. Method according to claim 1, wherein the conductive tracks are made of a metal or of a non-metal electrically-conductive material, particularly of doped single-crystal silicon or of polysilicon.

4. Structure for the implementation of the method according to claim 1, comprising the first and second wafers and at least the system for protecting the optoelectronic devices against electrostatic discharges.

5. Structure according to claim 4, wherein the protection system is common to a plurality of optoelectronic devices.

6. Structure according to claim 4, wherein the protection system comprises a diode.

* * * * *